United States Patent
Briere

(10) Patent No.: US 10,084,047 B2
(45) Date of Patent: *Sep. 25, 2018

(54) GROUP III-V DEVICE STRUCTURE WITH VARIABLE IMPURITY CONCENTRATION

(71) Applicant: Infineon Technologies Americas Corp., El Segundo, CA (US)

(72) Inventor: Michael A. Briere, Scottsdale, AZ (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/821,439

(22) Filed: Nov. 22, 2017

(65) Prior Publication Data

US 2018/0097072 A1    Apr. 5, 2018

Related U.S. Application Data

(60) Continuation of application No. 15/421,073, filed on Jan. 31, 2017, now Pat. No. 9,831,312, which is a division of application No. 14/844,283, filed on Sep. 3, 2015, now Pat. No. 9,564,492, which is a continuation of application No. 14/449,057, filed on Jul. 31, 2014, now Pat. No. 9,129,890, which is a division of application No. 13/604,517, filed on Sep. 5, 2012, now Pat. No. 8,796,738.

(Continued)

(51) Int. Cl.
| | |
|---|---|
| *H01L 29/20* | (2006.01) |
| *H01L 21/02* | (2006.01) |
| *H01L 29/15* | (2006.01) |
| *H01L 29/207* | (2006.01) |
| *H01L 29/778* | (2006.01) |
| *H01L 29/66* | (2006.01) |

(52) U.S. Cl.
CPC ...... *H01L 29/2003* (2013.01); *H01L 21/0251* (2013.01); *H01L 21/0254* (2013.01); *H01L 21/0262* (2013.01); *H01L 21/02389* (2013.01); *H01L 21/02458* (2013.01); *H01L 21/02505* (2013.01); *H01L 21/02584* (2013.01); *H01L 29/157* (2013.01); *H01L 29/207* (2013.01); *H01L 29/66462* (2013.01); *H01L 29/7787* (2013.01)

(58) Field of Classification Search
CPC combination set(s) only.
See application file for complete search history.

(56) References Cited

U.S. PATENT DOCUMENTS

| | | | |
|---|---|---|---|
| 2002/0195619 A1 | 12/2002 | Makimoto et al. | |
| 2006/0278892 A1* | 12/2006 | Harris | H01L 29/7783 257/194 |
| 2011/0062556 A1* | 3/2011 | Komiyama | H01L 21/02458 257/615 |

* cited by examiner

*Primary Examiner* — Ratisha Mehta
(74) *Attorney, Agent, or Firm* — Murphy, Bilak & Homiller, PLLC

(57) ABSTRACT

A semiconductor structure includes a substrate, a transition body over the substrate, a group III-V intermediate body having a bottom surface over the transition body and a group III-V device layer over a top surface of the group III-V intermediate body. The group III-V intermediate body has a first impurity concentration at the bottom surface, a second impurity concentration at the top surface, and a variable impurity concentration that rises and falls between the bottom surface and the top surface. The first impurity concentration is greater than the second impurity concentration.

20 Claims, 10 Drawing Sheets

Related U.S. Application Data

(60) Provisional application No. 61/537,540, filed on Sep. 21, 2011.

GROUP III-V DEVICE STRUCTURE WITH VARIABLE IMPURITY CONCENTRATION

BACKGROUND

I. Definitions

As used herein, the phrase "group III-V" refers to a compound semiconductor that includes a group V element and at least one group III element. Moreover, the phrase "III-Nitride" or "III-N" refers to a compound semiconductor that includes nitrogen (N) and at least one group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aP_bN_{(1-a-b)}$), for example. III-Nitride also refers generally to any polarity including but not limited to Ga-polar, N-polar, semi-polar or non-polarcrystal orientations. A III-Nitride material may also include either the Wurtzitic, Zincblende, or mixed polytypes, and may include single-crystal, monocrystalline, polycrystalline, or amorphous structures.

II. Background Art

Group III-V semiconductors, such as gallium nitride (GaN) or other III-Nitride materials, are used in many microelectronic implementations in which high power density and high efficiency switching are required. Examples of such implementations include field-effect transistors (FETs) and high electron mobility transistors (HEMTs).

Although the intrinsic material properties of III-Nitride semiconductors enable fabrication of high performance devices in theory, as a practical matter, conventional growth environments for III-Nitride materials typically include impurity sources. The presence of those impurity sources in the III-Nitride growth environment can cause unintentional doping of critical device layers. In HEMTs, for example, as well as in other high speed switching devices, such unintentional impurity doping may adversely compromise device performance.

SUMMARY

The present disclosure is directed to a group III-V device structure having a selectively reduced impurity concentration, substantially as shown in anchor described in connection with at least one of the figures, and as set forth more completely in the claims.

DETAILED DESCRIPTION

Figure 1:
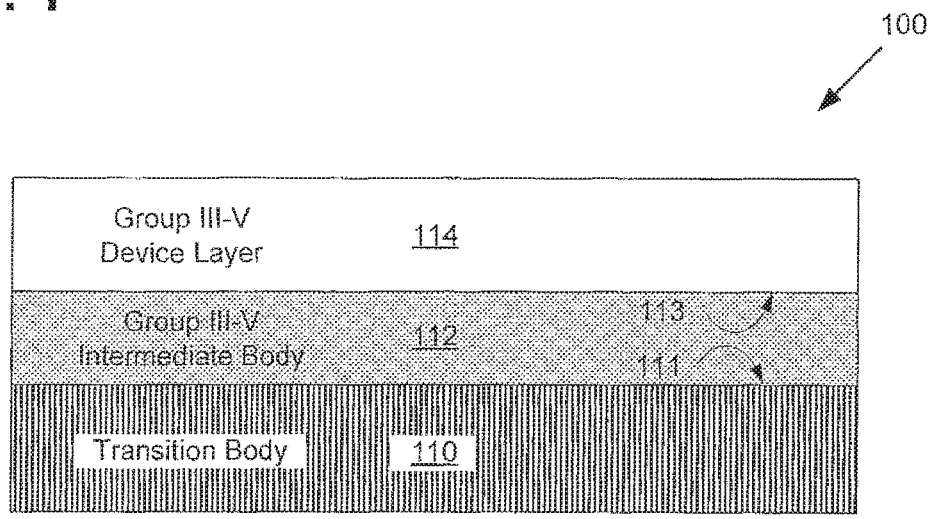
FIG. 1 presents a block structure corresponding to an exemplary group III-V device structure having a selectively reduced impurity concentration, according to one implementation.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Group III-V semiconductors include III-Nitride materials formed of gallium nitride (GaN) and/or its alloys, such as aluminum gallium nitride (AlGaN), indium gallium nitride (InGaN), and aluminum indium gallium nitride (AlInGaN). These materials are semiconductor compounds that have a relatively wide, direct bandgap and strong piezoelectric polarizations, and can enable high breakdown fields and the creation of two-dimensional electron gases (2DEGs). As a result, III-Nitride materials such as GaN are used in many microelectronic implementations in which high power density and high efficiency switching are required. Examples of such implementations include field-effect transistors (FETs), high electron mobility transistors (HEMTs), and diodes.

As previously discussed, although the intrinsic material properties of III-Nitride semiconductors enable fabrication of high performance devices in theory, as a practical matter, conventional growth environments for III-Nitride materials typically include impurity sources. For example, carbon impurities resulting from metalorganic sources may be introduced into III-Nitride materials grown using metalorganic vapor phase epitaxy (MOCVD), also known as organometallic vapor phase epitaxy (OMVPE). The presence of impurity sources in the III-Nitride growth environment can cause unintentional doping of critical device layers.

In transistors such as HEMTs, for example, unintentional impurity doping may undesirably result in an increased dynamic Rdson, and other effects adversely impacting device performance. However, it is noted that careful manipulation of the growth conditions used to produce III-Nitride or other group III-V semiconductor materials can selectively reduce the impurity profiles within certain key device regions to enhance or optimize device performance.

The present application discloses semiconductor materials including III-Nitride materials and methods of forming these materials so as to have continuously reduced, or otherwise selectively reduced, impurity concentrations. For example, by grading or otherwise tailoring the impurity concentration profiles within a layer or layers of a HEMT device structure, the present application enables formation of electronic devices which exhibit low leakage, low dynamic Rdson, high punch-through (lateral breakdown), and high vertical breakdown or standoff capability.

It is noted that although carbon impurity concentrations are specifically referenced in the application, different impurity species may be present and may be selectively reduced according to the present concepts. For example, carbon (C), oxygen (O), hydrogen (H), silicon (Si), germanium (Ge), magnesium (Mg), beryllium (Be), zinc (Zn), iron (Fe), chromium (Cr), and cadmium (Cd) may be unintentionally present or selectively introduced to specific layers or structures in a III-Nitride or other group III-V semiconductor structure. Furthermore, while these specific impurity materials are described, it will be appreciated that additional impurities can be included in a semiconductor structure without departing from the scope of the present concepts.

Moreover, it is further noted that impurity concentrations resulting from the presence of environmental impurity sources in the growth environment during growth of a III-Nitride or other group III-V material body can correspond in general to the growth rate and/or growth temperature of the body during its fabrication. For example, a decrease in impurity concentration of a III-Nitride body may result from a decrease in the growth rate of the III-Nitride body during growth. Conversely, a decrease in impurity concentration of a III-Nitride body may result from an increase in the growth temperature of the III-Nitride body during growth.

FIG. 1 presents a block structure corresponding to an exemplary group III-V device structure having a selectively reduced impurity concentration, according to one implementation. As shown in FIG. 1, semiconductor structure 100 includes transition body 110, group III-V intermediate body 112 having bottom surface 111 over transition body 110, and group III-V device layer 114 over top surface 113 of group III-V intermediate body 112. According to the present implementation, group III-V intermediate body 112 may be a doped III-Nitride layer. In some implementations, group III-V intermediate body 112 may be an impurity doped graded III-Nitride layer having a selectively reduced impurity concentration wherein a higher impurity concentration at bottom surface 111 is selectively reduced to a lower impurity concentration at top surface 113. Moreover, in one implementation, it may advantageous or desirable to fabricate group III-V intermediate body 112 so as to have a continuously reduced impurity concentration wherein a higher impurity concentration at bottom surface 111 is continuously reduced to a lower impurity concentration at top surface 113.

It is noted that when a layer or body is referred to as being "on", "over", or "overlying" another layer, body, or substrate, the layer or body described as "on", "over", or "overlying" can be directly on the underlying layer, body, or substrate, or an intervening layer or body may also be present. A layer described as "directly on" another layer, body, or substrate indicates that no intervening layer or body is present. It is further noted that when a layer or body is referred to as being "on", "over", or "overlying" another layer, body, or substrate, the layer or body described as "on", "over", or "overlying" may cover the entire underlying layer, body, or substrate, or a portion of the underlying layer, body, or substrate.

Moreover, as used herein, the term "impurity doped graded layer" or "impurity graded layer" refers to a layer having an impurity concentration profile that varies across at least a portion of the thickness of the layer. Thus, group III-V intermediate body 112 includes at least two different impurity concentrations at different depths within the layer. As is described in greater detail below, the impurity concentrations (e.g., dopant profiles) or grading schemes of group III-V intermediate body 112 can be varied in a number of ways. Although the selectively reduced impurity concentration may change across group III-V intermediate body 112 according to any of a variety of impurity concentration profiles, it may be advantageous for such a profile to have a higher impurity concentration at bottom surface 111 and a lower impurity concentration at top surface 113. It is generally advantageous to tailor the selective reduction of the impurity concentration within group III-V intermediate body 112 in a manner that provides sufficient device properties including low leakage, low dynamic Rdson, high punch-through (lateral breakdown) and high vertical breakdown/standoff capability.

In certain implementations, in addition to group III-V intermediate body 112 having a selectively reduced impurity concentration, group III-V intermediate body 112 may be a compositionally graded III-Nitride body. That is to say, group III-V intermediate body 112 may have a first III-Nitride composition at bottom surface 111 and a second III-Nitride composition above bottom surface 111, such as between bottom surface 111 and top surface 113.

In addition, it is noted that the impurity concentration of group III-V intermediate body 112 being selectively reduced as disclosed herein may be produced by more than one impurity species. Under those circumstances, one, two, or more of the impurity concentrations may be continuously or otherwise selectively reduced between bottom surface 111 and top surface 113, resulting in a reduced overall impurity concentration at top surface 113 relative to bottom surface 111. Moreover, the impurity concentrations corresponding respectively to each impurity species may be reduced based on similar or dissimilar impurity concentration profiles.

Figure 2:
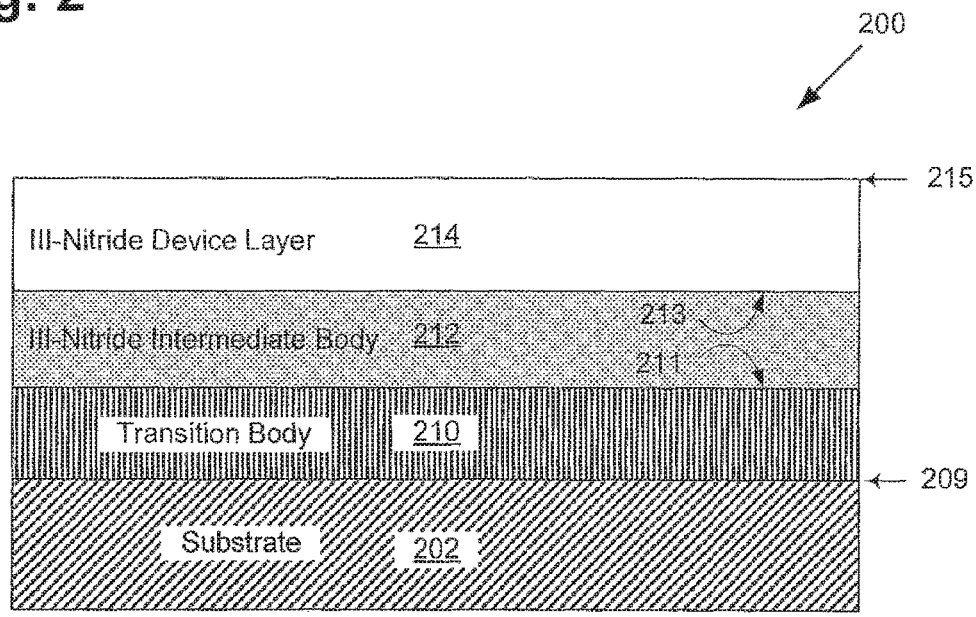
FIG. 2 presents a block structure corresponding to an exemplary group III-V device structure having a selectively reduced impurity concentration, according to another implementation.

FIG. 2 presents a block structure corresponding to an exemplary group III-V device structure having a selectively reduced impurity concentration, according to another implementation. As shown in FIG. 2, semiconductor structure 200 includes substrate 202, transition body 210 over substrate 202, III-Nitride intermediate body 212 having bottom surface 211 over transition body 210, and group III-Nitride device layer 214 over top surface 213 of group III-V intermediate body 212. According to the present implementation, III-Nitride intermediate body 212 may be an impurity doped graded Nitride body having a selectively reduced impurity concentration, wherein a higher impurity concentration at bottom surface 211 is selectively reduced to a lower impurity concentration at top surface 213.

Transition body 210, group III-Nitride intermediate body 212, and III-Nitride device layer 214 correspond in general to transition body 110, group III-V intermediate body 112, and group III-V device layer 114, respectively, in FIG. 1. Also shown in FIG. 2 are bottom surface 209 of transition body 210 and top surface 215 of III-Nitride device layer 214. Substrate 202 may be formed of materials such as silicon carbide (SiC), bulk III-Nitride material, Si, sapphire, or any other suitable material. Furthermore, substrate 202 may be single crystal, polycrystalline, or a composite substrate.

As used herein, a silicon, or Si, substrate may refer to any substrate that includes a silicon surface. Examples of suitable Si substrates include substrates that are composed entirely of Si (e.g., bulk Si wafers), silicon-on-insulator (SOI) substrates, silicon-on-sapphire substrates (SOS), and separation by implantation of oxygen (SIMOX) process substrates. Suitable Si substrates can also include composite substrates that have a silicon wafer bonded to another material such as diamond, aluminum nitride (AlN), or other polycrystalline materials.

In some implementations, Si substrates having different crystallographic orientations may be used. In some cases, silicon (111) substrates may be advantageous. In other cases, silicon (100) or (110) substrates may be preferred. In certain other implementations, the Si substrate, such as substrate 202, may have various device layers, homojunctions, heterojunctions or circuit layers embedded in the substrate, or formed on the front-side or back-side of the substrate. Such a silicon substrate may be semi-spec standard thickness, or thicker, or in some implementations thinner than semi-spec standards. In some implementations, for example, the Si substrate may have a diameter of less than one hundred millimeters (100 mm), while in other implementations, the substrate may have a diameter in a range from approximately 100 mm to approximately 150 mm. In yet other implementations, the substrate diameter may be in a range from approximately 150 mm to approximately 200 mm, or larger. In still other implementations, the silicon substrate may include a textured surface or may have a non-planer surface.

As shown in FIG. 2, transition body 210 is fabricated over substrate 202. Transition body 210 may be fabricated as a III-Nitride body including two or more interlayers as described in U.S. Provisional Patent Application No. 61/449,046, filed on Mar. 3, 2011 and titled "III-Nitride Material Interlayer Structures", and may further include other transition layers reported in U.S. Pat. No. 6,617,060, issued on Sep. 9, 2003 and titled "Gallium Nitride Materials And Methods"; U.S. Pat. No. 6,649,287, issued on Nov. 18, 2003 and titled "Gallium Nitride Materials And Methods"; U.S. patent application Ser. No. 12/587,964, filed on Oct. 14, 2009 and titled "Group III-V Semiconductor Device with Strain-relieving Interlayers"; and U.S. patent application Ser. No. 12/928,946, filed on Dec. 21, 2010 and titled "Stress Modulated Group III-V Semiconductor Device and Related Method", the entire disclosures of which are hereby incorporated fully by reference into the present application.

In addition, or alternatively, transition body 210 may include a III-Nitride or other group III-V transition structure. For example, transition body 210 may include a III-Nitride superlattice structure or structures as disclosed in U.S. Pat. No. 6,649,287 issued on Nov. 18, 2003 and titled "Gallium Nitride Materials And Methods"; U.S. Pat. No. 7,112,830 issued on Sep. 26, 2006 and titled "Super Lattice Modification Of Overlying Transistor"; U.S. Pat. No. 7,456,442 issued on Nov. 25, 2008 and titled "Super Lattice Modification Of Overlying Transistor"; and U.S. patent application Ser. No. 11/531,508 filed on Sep. 13, 2006 and titled "Process for Manufacture of Super Lattice Using Alternating High and Low Temperature Layers to Block Parasitic Current Path", the entire disclosures of which are hereby incorporated fully by reference into the present application.

In some implementations, transition body 210 includes a III-Nitride or other group III-V transition structure having a selectively modified impurity concentration such that a bottom surface impurity concentration of the group III-V transition structure is selectively modified to a top surface impurity concentration of the group III-V transition structure. For example, in one implementation, the impurity concentration of transition body 210 may be selectively modified between bottom surface 209 of transition body 210 and a top surface of transition body 210 underlying bottom surface 211 of III-Nitride intermediate body 212. Such a selective modification of the impurity concentration in transition body 210 may be performed utilizing a number of different impurity concentration profiles or dopant grading schemes. For example, the impurity concentration may be selectively modified continuously, in a step-wise manner, or may rise and fall between the bottom surface impurity concentration and the top surface impurity concentration. In addition, the impurity concentration may be selectively modified across the entire thickness of transition body 210, or across only a portion of transition body 210.

Referring to III-Nitride intermediate body 212, in some implementations, III-Nitride intermediate body 212 may be a binary constant composition such as AlN, GaN, or indium nitride (InN), for example. However, in other implementations, it may be preferable that the III-Nitride intermediate body 212 be composed of an alloy of a III-Nitride material such as $Al_xIn_yGa_{(1-x-y)}N$, $Al_xGa_{(1-x)}N$, and $In_yGa_{(1-y)}N$. It is noted, moreover, that III-Nitride materials having other compositions may also be used.

As further shown in FIG. 2, III-Nitride intermediate body 212 having bottom surface 211 is fabricated over transition body 210. III-Nitride intermediate body 212 may be of constant alloy composition, or in certain other implementations, may be compositionally graded between bottom surface 211 and top surface 213. In one implementation, for example, the alloy composition of III-Nitride intermediate body 212 may be continuously graded between bottom surface 211 and top surface 213. III-Nitride device layer 214 may then be fabricated over top surface 213 of III-Nitride intermediate body 212.

When semiconductor structure 200 forms a HEMT, it may be advantageous to fabricate III-Nitride device layer 214 to include a GaN channel layer (GaN channel layer not shown as such in FIG. 2) having a low impurity concentration so as to minimize trapping centers and enhance 2DEG formation within III-Nitride device layer 214. However, in certain other implementations, it may be preferable that III-Nitride device layer 214 be intentionally doped wither either N type or P type dopants, depending on the device design and intended application. In substantially all cases, reducing the impurity concentration, for example, the carbon impurity concentration, within III-Nitride device layer 214 as well as reducing the impurity concentration across at least a portion of III-Nitride intermediate body 212 is desirable.

For example, it may be advantageous or desirable to continuously reduce the impurity concentration between bottom surface 211 and top surface 213 of III-Nitride intermediate body 212 in a manner consistent with the penetration depth of critical electric fields produced by application of a drain bias voltage to a device fabricated in III-Nitride device layer 214. It is noted that, as used herein, critical electric field is defined as the minimum field, associated with an applied voltage on the drain, which results in a high probability of changing the charge state of an impurity residing within the critical electric field perimeter within a III-Nitride layer(s). The critical electric field is proportional to the maximum applied drain bias voltages during operation of the device. As a result, in certain implementations, it may be desirable for III-Nitride intermediate body 212 to have a higher impurity concentration at bottom surface 211 and a lower impurity concentration at top surface 213. It may also be advantageous to have the lower impurity concentration at top surface 213 be maintained at a substantially constant low level into III-Nitride device layer 214.

The impurity concentration in III-Nitride intermediate body 212 may be reduced between bottom surface 211 and top surface 213 utilizing a number of different impurity concentration profiles or dopant grading schemes. For example, the impurity concentration may be reduced continuously, in a step-wise manner, or may rise and fall between the higher impurity concentration and the lower impurity concentration, for example. In addition, the impurity concentration may be reduced across the entire thickness of III-Nitride intermediate body 212, or across only a portion of the thickness.

FIGS. 3, 4, 5A through 5H, 6A through 6D, and 7A through 7F (hereinafter "FIGS. 3-7F") illustrate exemplary impurity concentration profiles for which the impurity concentration is selectively reduced as a function of thickness across III-Nitride intermediate body 212 or semiconductor structure 200. The selective reduction in impurity concentration represented by FIGS. 3-7F may be seen to correspond to the selective reduction in carbon concentration across the thickness of III-Nitride intermediate body 212 or semiconductor structure 200, in FIG. 2. However, it is to be understood that in other implementations the graphs shown in any or all of FIGS. 3-7F may represent the concentration of other impurities or dopants (e.g., H, O). The convention used in the present figures is that the thickness of III-Nitride intermediate body 212 or semiconductor structure 200, in FIG. 2, increases in the direction away from bottom surface 211 of III-Nitride intermediate body 212 and towards top surface 215 of III-Nitride device layer 214.

The impurity concentration profiles represented in FIGS. 3-7F can correspond in general to the growth rate and/or growth temperature of III-Nitride intermediate body 212, as noted above. For example, fabricating III-Nitride intermediate body 212 so as to selectively reduce its impurity concentration from a higher impurity concentration at bottom surface 211 to a lower impurity concentration at top surface 213 may correspond to selectively reducing the growth rate of III-Nitride intermediate body 212 from a higher growth rate at bottom surface 211 to a lower growth rate at top surface 213. Conversely, fabricating III-Nitride intermediate body 212 so as to selectively reduce its impurity concentration from a higher impurity concentration at bottom surface 211 to a lower impurity concentration at top surface 213 may correspond to selectively increasing the growth temperature of III-Nitride intermediate body 212 from a lower growth temperature at bottom surface 211 to a higher growth temperature at top surface 213.

As a specific example of the latter implementation, the growth temperature at bottom surface 211 of III-Nitride intermediate body 212 may be approximately 930° C. and may remain substantially unchanged during the first approximately 1 micrometer (1 um) of growth. Thereafter, the growth temperature may be increased by approximately 20° C. to approximately 40° C. For each approximately 1 um of growth, up to a higher temperature in a range from approximately 1000° C. to approximately 1020° C. at top surface 213. Such an increase temperature may be continuous or step-wise, for example.

Figure 3:
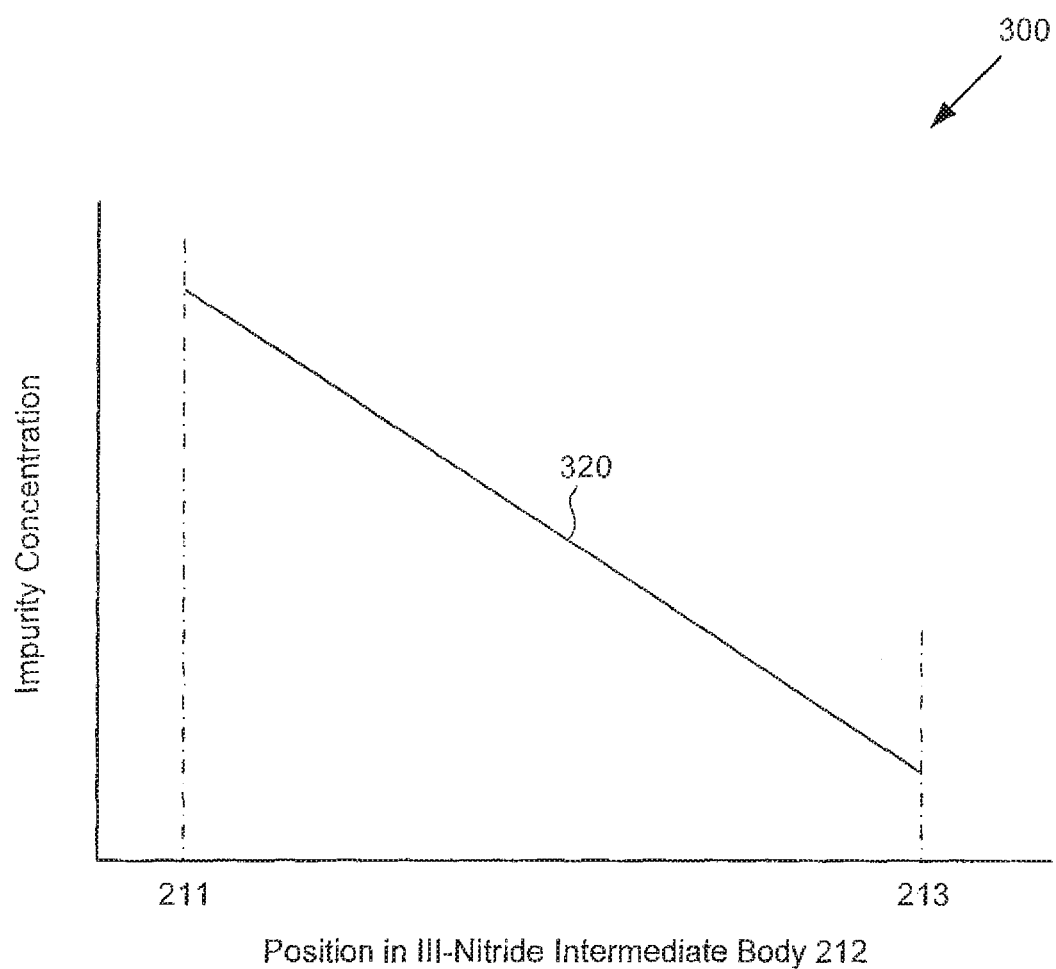
FIG. 3 presents a graph corresponding to a selectively reduced impurity concentration, showing a continuous reduction in impurity concentration across portions of the III-Nitride device structure shown by FIG. 2, according to one exemplary implementation.

Referring to FIG. 3, FIG. 3 presents graph 300 corresponding to a continuously reduced impurity concentration across III-Nitride intermediate body 212, in FIG. 2, according to an exemplary implementation. Graph 300 includes impurity concentration profile 320 showing a continuous reduction of impurity concentration at a substantially constant rate from bottom surface 211 to top surface 213 of III-Nitride intermediate body 212.

Figure 4:
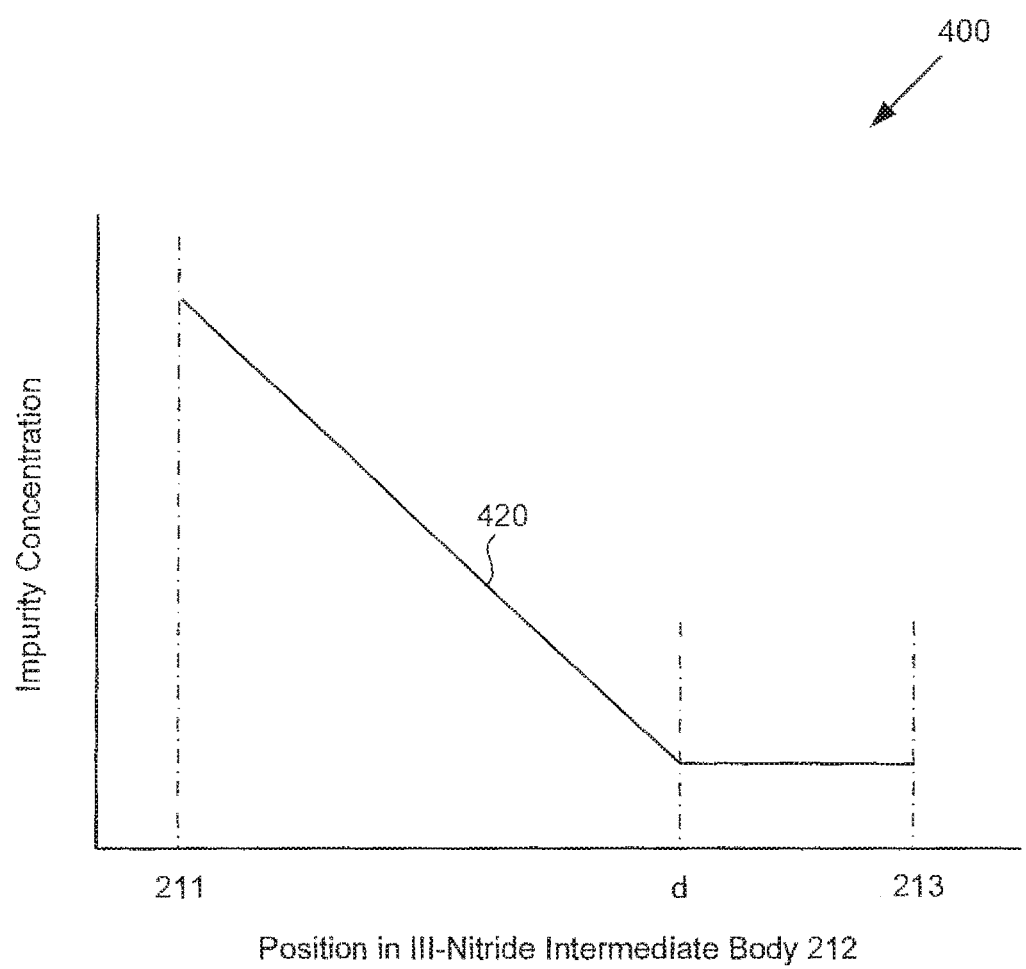
FIG. 4 presents a graph corresponding to a selectively reduced impurity concentration, showing a continuous reduction in impurity concentration across portions of the III-Nitride device structure shown by FIG. 2, according to another exemplary implementation.

Moving to FIG. 4, FIG. 4 presents graph 400 corresponding to another exemplary implementation of a reduced impurity concentration across III-Nitride intermediate body 212. Graph 400 includes impurity concentration profile 420 showing a continuous reduction of impurity concentration at a substantially constant rate from bottom surface 211 to a depth within III-Nitride intermediate body 212 denoted as "d". The continuously reduced impurity concentration shown by impurity concentration profile 420 then maintains a substantially constant value at an impurity concentration lower than the impurity concentration at bottom surface 211 between depth "d" and top surface 213 of III-Nitride intermediate body 212.

Figure 5A:
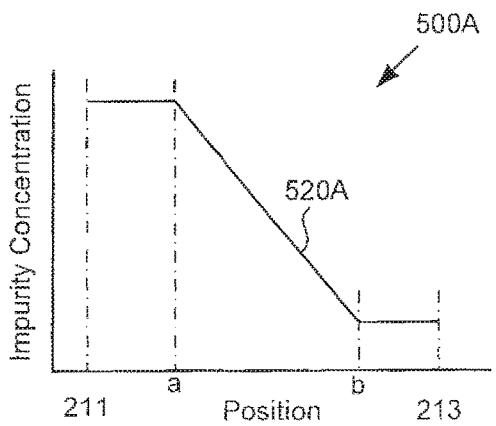
FIG. 5A presents a graph corresponding to a selectively reduced impurity concentration, showing a continuous reduction in impurity concentration across portions of the III-Nitride device structure shown by FIG. 2, according to another exemplary implementation.

FIG. 5A presents graph 500A corresponding to another exemplary implementation of a continuously reduced impurity concentration across III-Nitride intermediate body 212. Graph 500A includes impurity concentration profile 520A showing an initial substantially constant impurity concentration from bottom surface 211 to first intermediate depth "a", and then a continuous reduction of the impurity concentration at a substantially constant rate as a function of position from depth "a" to depth "b" within III-Nitride intermediate body 212. The continuously reduced impurity concentration shown by impurity concentration profile 520A then maintains a substantially constant value at an impurity concentration lower than the impurity concentration at bottom surface 211 between depth "b" and top surface 213 of III-Nitride intermediate body 212.

Figure 5B:
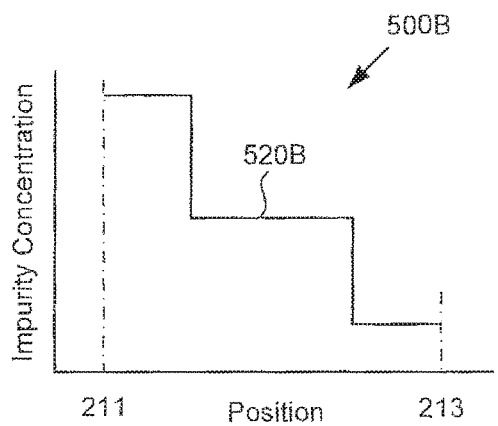
FIG. 5B presents a graph corresponding to a selectively reduced impurity concentration across portions of the III-Nitride device structure shown by FIG. 2, according to another exemplary implementation.
Figure 5C:
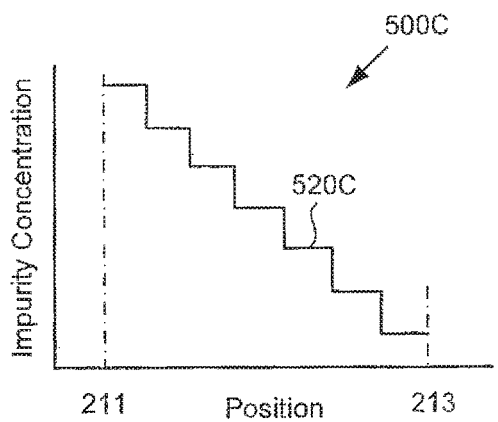
FIG. 5C presents a graph corresponding to a selectively reduced impurity concentration across portions of the III-Nitride device structure shown by FIG. 2, according to another exemplary implementation.

FIG. 5B presents graph 500B corresponding to another exemplary implementation of a reduced impurity concentration across III-Nitride intermediate body 212. Graph 500B includes impurity concentration profile 52013 showing a selective step-wise reduction of impurity concentration which includes two steps. Moreover, FIG. 5C presents graph 500C showing impurity concentration profile 520C of a step-wise reduction of impurity concentration as a function of thickness including multiple steps.

Figure 5D:
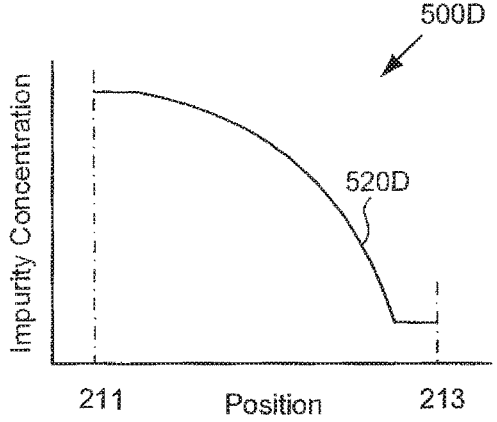
FIG. 5D presents a graph corresponding to a selectively reduced impurity concentration, showing a continuous reduction in impurity concentration across portions of the III-Nitride device structure shown by FIG. 2, according to another exemplary implementation.
Figure 5E:
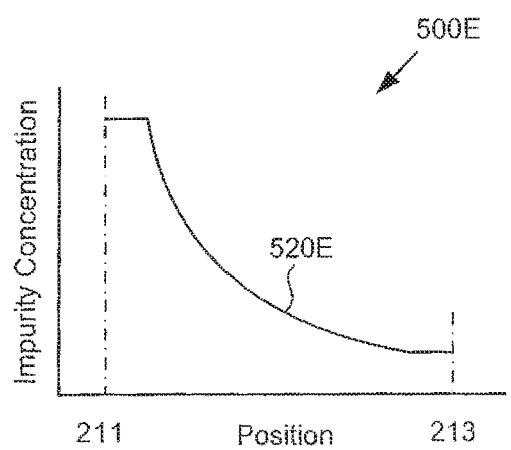
FIG. 5E presents a graph corresponding to a selectively reduced impurity concentration, showing a continuous reduction in impurity concentration across portions of the III-Nitride device structure shown by FIG. 2, according to another exemplary implementation.
Figure 5F:
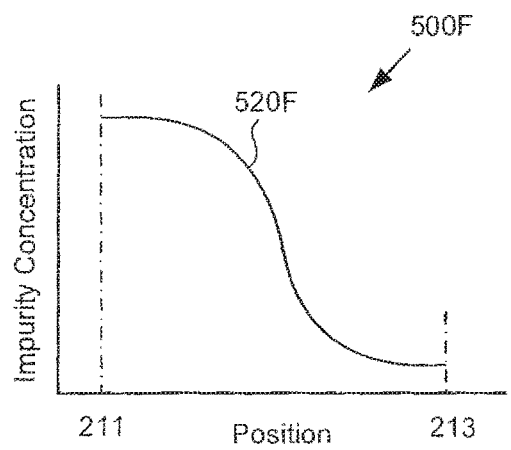
FIG. 5F presents a graph corresponding to a selectively reduced impurity concentration, showing a continuous reduction in impurity concentration across portions of the III-Nitride device structure shown by FIG. 2, according to another exemplary implementation.

FIGS. 5D, 5E, and 5F show respective graphs 500D, 500E, and 500F of impurity concentration profiles 520D, 520E, and 520F, respectively, depicting selectively reduced impurity concentrations that are continuously reduced at various exponential rates from a higher impurity concentration to a lower impurity concentration. It is noted that the higher impurity concentration is substantially equal to the impurity concentration at bottom surface 211 of III-Nitride intermediate body 212, while the lower impurity concentration is substantially equal to the impurity concentration at top surface 213 of III-Nitride intermediate body 212.

Figure 5G:
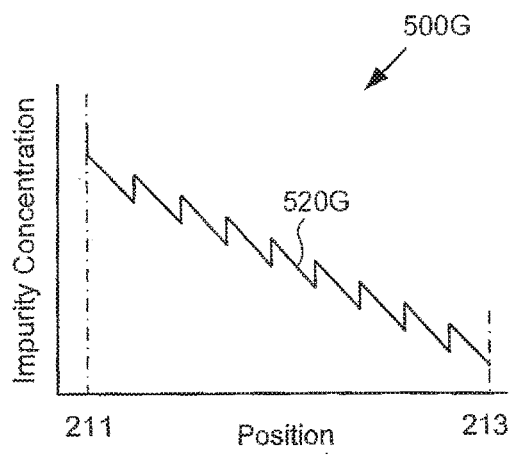
FIG. 5G presents a graph corresponding to a selectively reduced impurity concentration across portions of the III-Nitride device structure shown by FIG. 2, according to another exemplary implementation.
Figure 5H:
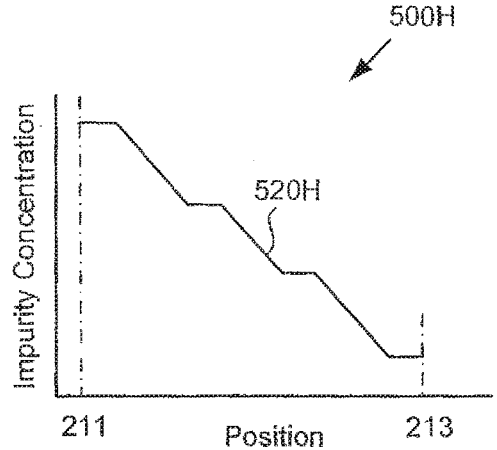
FIG. 5H presents a graph corresponding to a selectively reduced impurity concentration across portions of the III-Nitride device structure shown by FIG. 2, according to another exemplary implementation.

FIG. 5G presents graph 500G corresponding to another exemplary implementation of a selectively reduced impurity concentration across III-Nitride intermediate body 212. Graph 500G includes impurity concentration profile 520G showing that the impurity concentration may rise and fall between the higher impurity concentration at bottom surface 211 and the lower impurity concentration at top surface 213. In addition, FIG. 5H presents graph 500H showing impurity concentration profile 520H of a step-wise reduction of impurity concentration including continuous and substantially constant reductions in impurity concentration between adjacent steps.

In some implementations, III-Nitride intermediate body 212 may be an impurity graded superlattice, or an impurity graded or compositionally graded superlattice. That is to say, III-Nitride intermediate body 212 may include two or more alternating sub-layers of III-Nitride materials having different III-Nitride compositions. Moreover, the two or more alternating sub-layers may have different impurity concentrations, or different selectively reduced impurity concentration profiles. Four exemplary superlattice implementations are shown in FIGS. 6A through 6D.

Figure 6A:
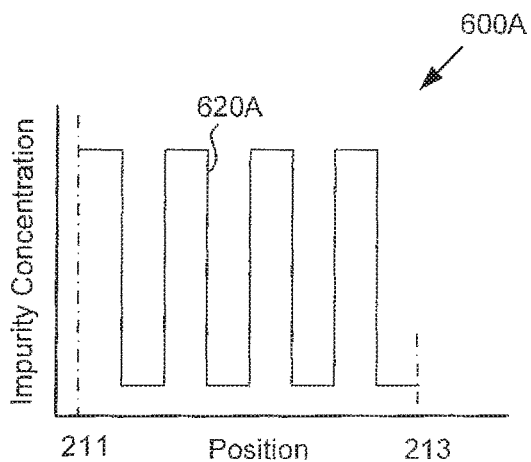
FIG. 6A presents a graph corresponding to a selectively reduced impurity concentration across portions of the III-Nitride device structure shown by FIG. 2, according to another exemplary implementation.

Referring to FIG. 6A, FIG. 6A presents graph 600A corresponding to another exemplary implementation of a selectively reduced impurity concentration across III-Nitride intermediate body 212. Graph 600A includes impurity concentration profile 620A showing an exemplary impurity concentration profile resulting from alternating sub-layers when III-Nitride intermediate body 212 is fabricated as a superlattice. According to the implementation shown in FIG. 6A, each alternating sub-layer of the superlattice has a different but substantially constant impurity concentration level throughout the sub-layer. A stepwise change in impurity concentration occurs at the sub-layer interfaces and results in a reduced impurity concentration from bottom surface 211 to top surface 213.

Figure 6B:
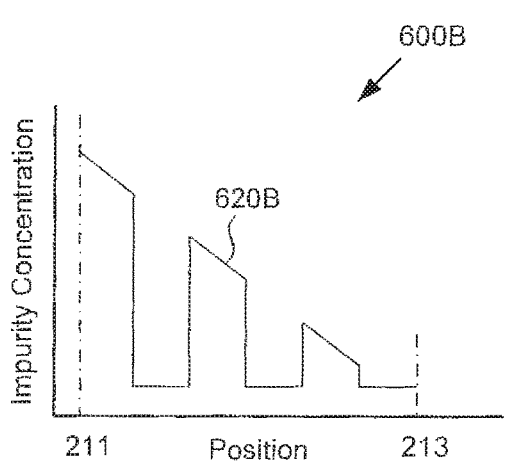
FIG. 6B presents a graph corresponding to a selectively reduced impurity concentration across portions of the III-Nitride device structure shown by FIG. 2, according to another exemplary implementation.

Moving to FIG. 6B, FIG. 6B presents graph 600B corresponding to another exemplary implementation of a selectively reduced impurity concentration across III-Nitride intermediate body 212. Graph 600B includes impurity concentration profile 620B showing another exemplary impurity concentration profile resulting from alternating sub-layers when III-Nitride intermediate body 212 is fabricated as a superlattice. According to the implementation shown in FIG. 6B, one of the sub-layer impurity concentrations is held substantially constant across the superlattice layer at the lower impurity concentration. The other sub-layer has a graded impurity concentration which continuously decreases at a substantially constant rate across the superlattice sub-layer.

Figure 6C:
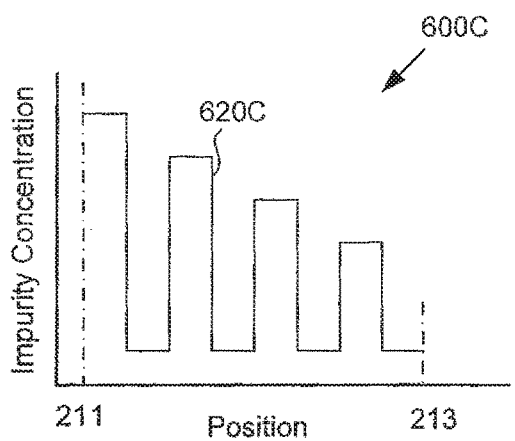
FIG. 6C presents a graph corresponding to a selectively reduced impurity concentration across portions of the III-Nitride device structure shown by FIG. 2, according to another exemplary implementation.
Figure 6D:
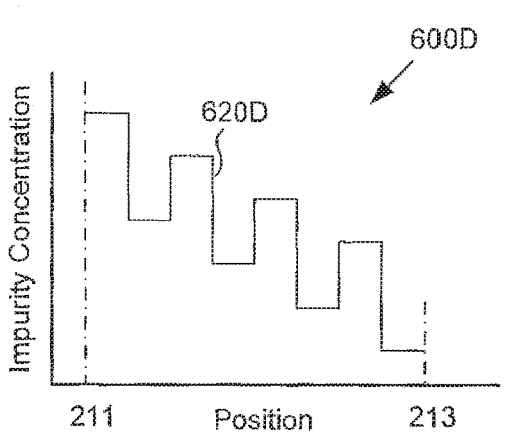
FIG. 6D presents a graph corresponding to a selectively reduced impurity concentration across portions of the III-Nitride device structure shown by FIG. 2, according to another exemplary implementation.

In FIG. 6C, impurity concentration profile 620C of graph 600C also shows that one of the sub-layer impurity concentrations is held substantially constant across each iteration of the sub-layer within the superlattice at the lower impurity concentration. However, according to the exemplary implementation of FIG. 6C, the intervening sub-layers have respective impurity concentrations that decrease in a step-wise fashion across the superlattice, while remaining substantially constant within each sub-layer of the superlattice. Alternatively, impurity concentration profile 620D of graph 600D, in FIG. 6D, shows both alternating sets of sub-layers within the superlattice having impurity concentration profiles that decrease stepwise across the superlattice, while remaining substantially constant within each sub-layer of the superlattice.

It is reiterated that the impurity concentration profiles of III-Nitride intermediate body 212 illustrated in FIGS. 3 through 6D are merely exemplary. In other implementations, the impurity concentration of III-Nitride body 212 may be selectively reduced according to other profiles that are within the scope of the present inventive concepts. Moreover, in addition to selectively reducing the impurity concentration across III-Nitride intermediate body 212 from bottom surface 211 to top surface 213, the present concepts also include tailoring the impurity concentration profile across other portions of semiconductor structure 200, as shown in FIGS. 7A through 7F.

Figure 7A:
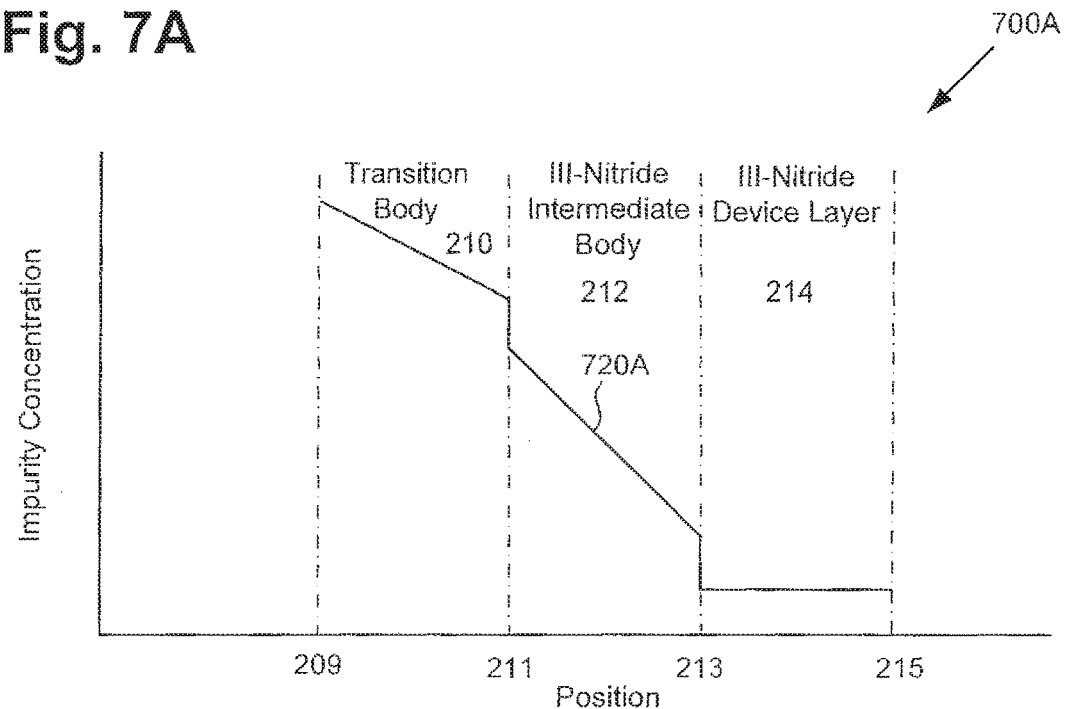
FIG. 7A presents a graph corresponding to a selectively reduced impurity concentration, showing a continuous reduction in impurity concentration across portions of the III-Nitride device structure shown by FIG. 2, according to another exemplary implementation.

FIG. 7A presents graph 700A corresponding to a selectively reduced impurity concentration, showing a continuous reduction in impurity concentration across portions of semiconductor structure 200, in FIG. 2, according to one exemplary implementation. Graph 700A includes impurity concentration profile 720A showing a continuous and substantially constant reduction in impurity concentration across transition body 210 from bottom surface 209 of transition body 210 to bottom surface 211 of III-Nitride intermediate body 212. Impurity concentration profile 720A then shows a stepped reduction in impurity concentration at bottom surface 211 of III-Nitride intermediate body 212, followed by a continuous and substantially constant reduction in impurity concentration across III-Nitride intermediate body 212 to top surface 213 of III-Nitride intermediate body 212. It is noted that the respective substantially constant rates of reduction across transition body 210 and III-Nitride intermediate body 212 may be different rates of reduction, as shown in FIG. 7A, or they may be substantially the same rate of reduction. Impurity concentration profile 720A then continues with another stepped reduction in impurity concentration at top surface 213 of III-Nitride intermediate body 212, followed by a substantially constant low level impurity concentration throughout III-Nitride device layer 214, to top surface 215.

Figure 7B:
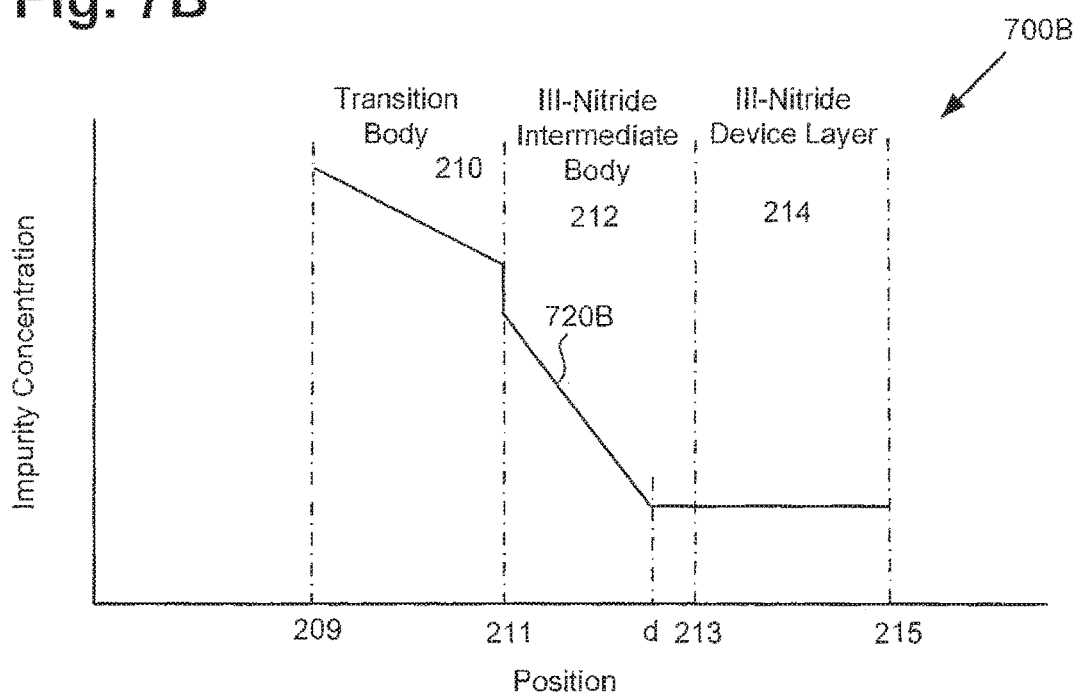
FIG. 7B presents a graph corresponding to a selectively reduced impurity concentration, showing a continuous reduction in impurity concentration across portions of the III-Nitride device structure shown by FIG. 2, according to another exemplary implementation.

Referring to FIG. 7B, FIG. 7B presents graph 700B corresponding to a selectively reduced impurity concentration, showing a continuous reduction in impurity concentration across portions of semiconductor structure 200, according to another exemplary implementation. Graph 700B includes impurity concentration profile 720B showing a continuous and substantially constant reduction in impurity concentration at a first rate of reduction across transition body 210 from bottom surface 209 of transition body 210 to bottom surface 211 of III-Nitride intermediate body 212. Impurity concentration profile 720B then shows a stepped reduction in impurity concentration at bottom surface 211 of III-Nitride intermediate body 212, followed by a continuous and substantially constant reduction in impurity concentration at a second rate of reduction, from bottom surface 211 to depth "d" in III-Nitride intermediate body 212. Impurity concentration profile 720B then shows a substantially constant low level impurity concentration from depth "d" through top surface 213 of III-Nitride intermediate body 212, to top surface 215 of III-Nitride device layer 214.

Figure 7C:
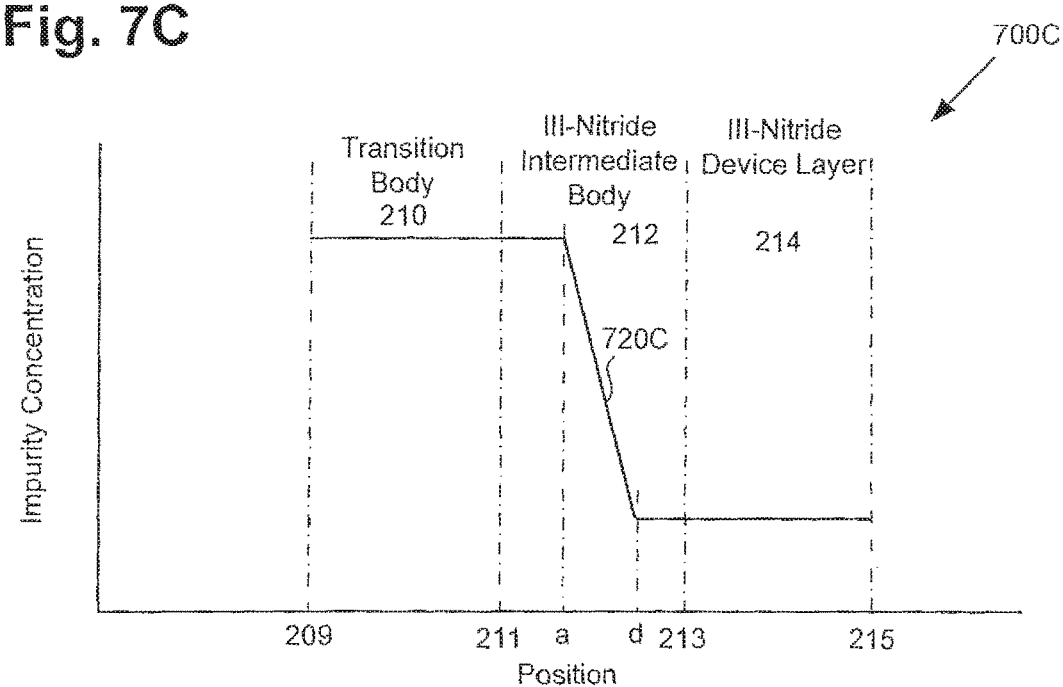
FIG. 7C presents a graph corresponding to a selectively reduced impurity concentration, showing a continuous reduction in impurity concentration across portions of the III-Nitride device structure shown by FIG. 2, according to another exemplary implementation.

Moving to FIG. 7C, FIG. 7C presents graph 700C corresponding to a selectively reduced impurity concentration, showing a continuous reduction in impurity concentration across portions of semiconductor structure 200, according to still another exemplary implementation. Graph 700C includes impurity concentration profile 720C showing a continuous and substantially constant high impurity concentration across transition body 210 and across bottom surface 211 of III-Nitride intermediate body 212 to depth "a" in III-Nitride intermediate body 212. Impurity concentration profile 720C then shows a continuous and substantially constant reduction in purity concentration from depth "a" to depth "d" in III-Nitride intermediate body 212. Impurity concentration profile 720C further shows a substantially constant low level impurity concentration from depth "d" through top surface 213 of III-Nitride intermediate body 212, to top surface 215 of III-Nitride device layer 214.

Figure 7D:
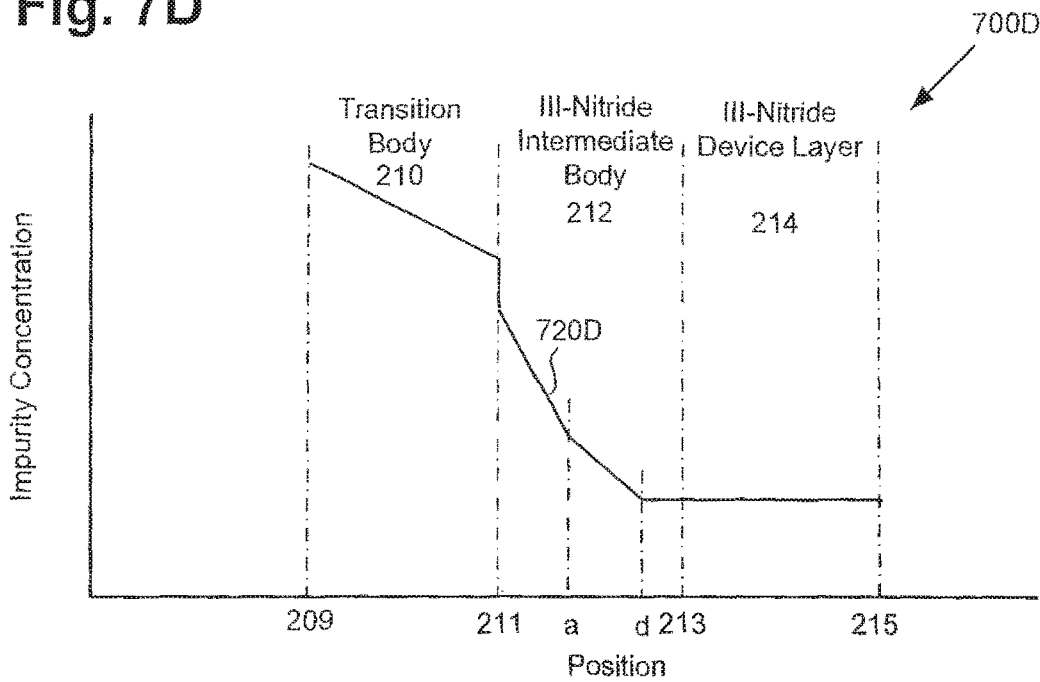
FIG. 7D presents a graph corresponding to a selectively reduced impurity concentration, showing a continuous reduction in impurity concentration across portions of the III-Nitride device structure shown by FIG. 2, according to another exemplary implementation.

Referring to FIG. 7D, FIG. 7D presents graph 700D corresponding to a selectively reduced impurity concentration, showing a continuous reduction in impurity concentration across portions of semiconductor structure 200, according to another exemplary implementation. Graph 700D includes impurity concentration profile 720D showing a continuous and substantially constant reduction in impurity concentration at a first rate of reduction across transition body 210 from bottom surface 209 of transition body 210 to bottom surface 211 of III-Nitride intermediate body 212. Impurity concentration profile 720D then shows a stepped reduction in impurity concentration at bottom surface 211 of III-Nitride intermediate body 212, followed by a continuous and substantially constant reduction in impurity concentration at a second rate of reduction, from bottom surface 21 to depth "a" in III-Nitride intermediate body 212. Impurity concentration, profile 720D also shows a continuous and substantially constant reduction in impurity concentration at a third rate of reduction from depth "a" to depth "d" in III-Nitride intermediate body 212. Impurity concentration profile 720D then shows a substantially constant low level impurity concentration from depth "d" through top surface 213 of III-Nitride intermediate body 212, to top surface 215 of III-Nitride device layer 214.

Figure 7E:
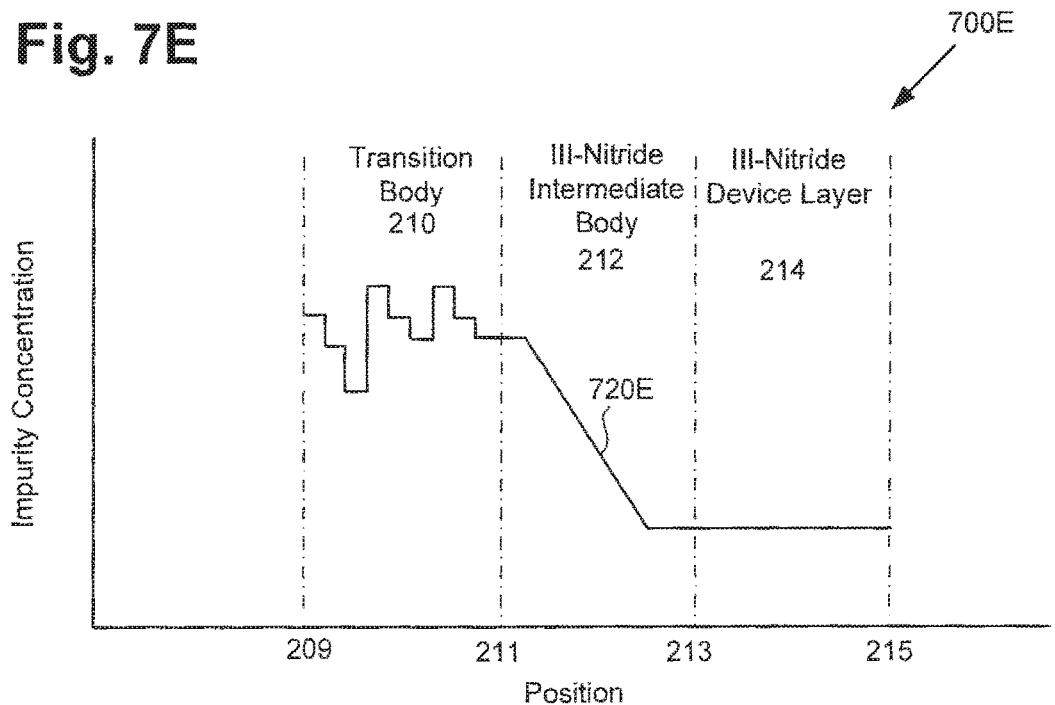
FIG. 7E presents a graph corresponding to a selectively modified impurity concentration across portions of a transition body of the III-Nitride device structure shown by FIG. 2, and showing a continuous reduction in impurity concentration across a portion of the intermediate body of the device structure, according to one exemplary implementation.

FIG. 7E presents graph 700E corresponding to a selectively modified impurity concentration across portions of transition body 210 of semiconductor structure 200, and a continuous reduction in impurity concentration across a portion of III-Nitride intermediate body 212, according to one exemplary implementation. Graph 700E includes impurity concentration profile 720E showing a selectively modified impurity concentration across transition body 210, followed by a continuous and substantially constant reduction in impurity concentration within III-Nitride intermediate body 212, followed in turn by a substantially constant low level impurity concentration across III-Nitride device layer 214.

Figure 7F:
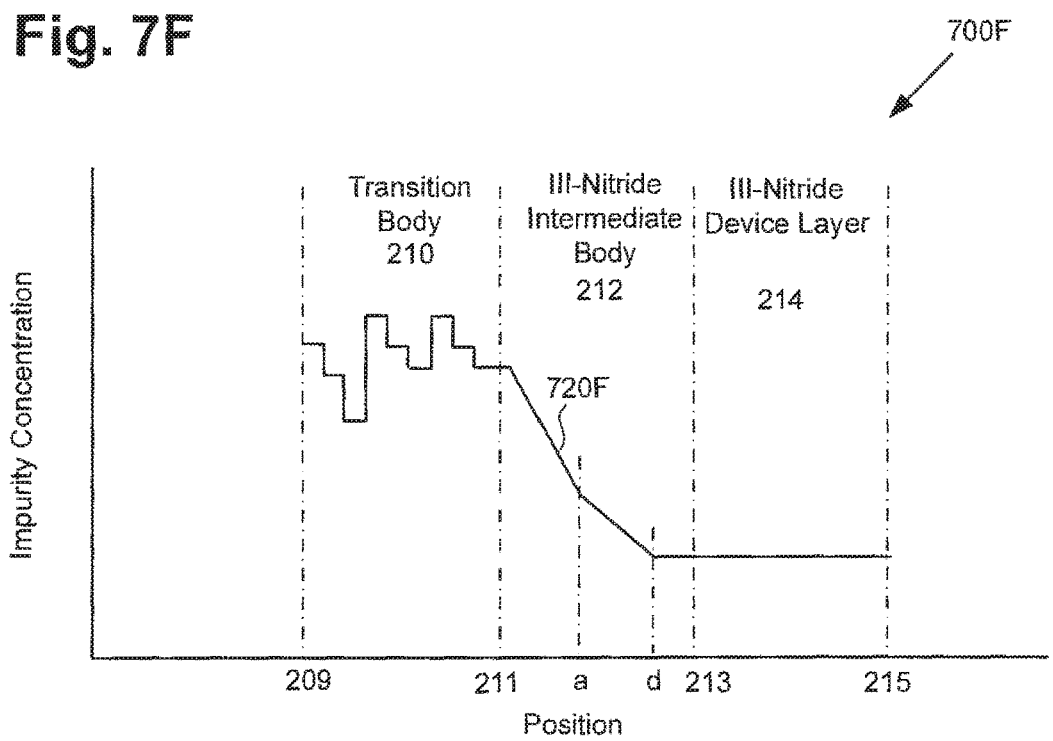
FIG. 7F presents a graph corresponding to a selectively modified impurity concentration across portions of a transition body of the III-Nitride device structure shown by FIG. 2, and showing a continuous reduction in impurity concentration across a portion of the III-Nitride intermediate body of the device structure, according to another exemplary implementation.

FIG. 7F presents graph 700F corresponding to a selectively modified impurity concentration across portions of transition body 210 of semiconductor structure 200, and a continuous reduction in impurity concentration across a portion of III-Nitride intermediate body 212, according to another exemplary implementation. Graph 700F includes impurity concentration profile 720F showing a selectively modified impurity concentration across transition body 210. Impurity concentration profile 720F shows a selectively modified impurity concentration from a bottom surface impurity concentration at bottom surface 209 of transition body 210 to a top surface impurity concentration substantially matching the impurity concentration at bottom surface 211 of III-Nitride intermediate body 212. Impurity concentration profile 720F is then continuously reduced at a first rate of reduction across III-Nitride intermediate body 212 to depth "a" in III-Nitride intermediate body 212. Impurity concentration profile 720F also shows a continuous and substantially constant reduction in impurity concentration at a second rate of reduction from depth "a" to depth "d" in III-Nitride intermediate body 212. Impurity concentration profile 720F then shows a substantially constant low level impurity concentration from depth "d" through top surface 213 of III-Nitride intermediate body 212, to top surface 215 of III-Nitride device layer 214.

The impurity concentration profile across transition body 210 may be step-wise and may rise and fall, as shown in FIGS. 7E and 7F, and/or may correspond to a transition layer scheme, including additional interlayers each having a different respective impurity concentration, as described in U.S. Provisional Patent Application No. 61/449,046, filed on Mar. 3, 2011 and titled "III-Nitride Material Interlayer Structures," the entire disclosure of which is hereby incorporated fully by reference into the present application. The impurities or dopants giving rise to the impurity concentration profile of transition body 210 may be unintentionally present or may be intentionally added during fabrication of transition body 210.

III-Nitride device layer 214 of semiconductor structure 200, in FIG. 2, may include a FET or a HEMT, for example. In implementations in which semiconductor structure 200 forms a HEMT, III-Nitride device layer 214 may be seen to represent any or all of several layers including, for example, a GaN channel layer, an AlN spacer layer, an AlGaN barrier layer and other layers including passivation, metal, and P type III-Nitride gate layers needed for device formation.

In implementations in which III-Nitride device layer 214 corresponds to a GaN channel layer of a HEMT device, it may be desirable for the impurity concentration, and in particular for the concentration of P type impurities, to be substantially minimized. For example, an undesirably high P type or other impurity concentration may interfere with electron mobility and 2DEG formation, and in some instances may result in increased dynamic Rdson, increased leakage, and lower standoff or breakdown voltages. In practice, the thickness of the GaN channel layer may be relatively thin. That is to say, the GaN channel layer may be no thicker than necessary to support heterojunction formation such that a conductive 2DEG channel forms near the heterojunction interface.

In some implementations, III-Nitride device layer 214 may be implemented as a GaN channel layer having a thickness in a range from approximately 0.1 um to approximately 0.5 um. In other implementations, III-Nitride device layer 214 may be implemented as a GaN channel layer having a thickness in a range from approximately 0.15 um to approximately 0.25 um. Several HEMT structures formed of various III-Nitride device layers corresponding to III-Nitride device layer 214 are described in U.S. Pat. No. 6,849,882, issued on Feb. 1, 2005 and titled "Group-III Nitride Based High Electron Mobility Transistor (HEMT) with Barrier/Spacer Layer"; U.S. Pat. No. 7,382,001, issued on Jun. 3, 2008 and titled "Enhancement Mode III-Nitride FET"; U.S. Pat. No. 7,759,699, issued on Jul. 20, 2010 and titled "III-Nitride Enhancement Mode Devices"; U.S. Pat. No. 5,192,987, issued on Mar. 9, 1993 and titled "High Electron Mobility Transistor with GAN/ALXGA1-XN Heterojunctions"; and U.S. Pat. No. 7,745,849, issued on Jun. 29, 2010 and titled "Enhancement Mode III-Nitride Semiconductor Device with Reduced Electric Field Between the Gate and the Drain"; as well as U.S. patent application Ser. No. 13/021,437, filed on Feb. 4, 2011, and titled "Programmable III-Nitride Transistor with Aluminum-Doped Gate"; U.S. patent application Ser. No. 13/017,970, filed on Jan. 31, 2011 and titled "Enhancement Mode III-Nitride Transistors with Single Gate Dielectric Structure"; U.S. patent application Ser. No. 12/653,097, filed on Dec. 7, 2009 and titled "Gated AlGaN/GaN Heterojunction Schottky Device"; U.S. patent application Ser. No. 12/195,801, filed on Aug. 21, 2008 and titled "Enhancement Mode III-Nitride Device with Floating Gate and Process for Its Manufacture"; U.S. patent application Ser. No. 12/211,120, filed on Sep. 16, 2008 and titled "III-Nitride Semiconductor Device with Reduced Electric Field Between Gate and Drain and Process for Its Manufacture"; and U.S. patent application Ser. No. 11/857,113, filed on Sep. 18, 2007 and titled "III-Nitride Power Semiconductor Device Having a Programmable Gate", the entire disclosures of which are hereby incorporated fully by reference into the present application.

In some implementations, semiconductor structure 200 may form a high voltage FET or HEMT. In such implementations, the device geometries and/or III-Nitride material layer thicknesses may need to be altered to accommodate the high voltage and resulting critical high voltage electric fields. For example, as the applied voltage is increased for a given device, the electric field associated with the drain electrode will also increase in both the lateral direction and the penetration depth into the device structure. At higher applied voltages in a HEMT structure, the penetration depth of the electric field may extend under the drain region to a depth greater than the 2DEG, and perhaps greater than the thickness of III-Nitride device layer 214, thereby extending into III-Nitride intermediate body 212. Under such condition Ay impurities within the channel region of III-Nitride device layer 214, or even within some regions of III-Nitride intermediate body 212, may act as trapping centers and may subsequently change the charge state within the effected layers, resulting in degradation of high voltage HEMT performance. As a result, it may be desirable to reduce or substantially minimize the impurity concentrations not only in the channel region of III-Nitride device layer 214, but also into III-Nitride intermediate body 212.

By contrast, it may be advantageous to have a relatively high impurity concentration, such as a high carbon concentration, below III-Nitride device layer 214 in order to improve the resistivity of III-Nitride intermediate body 212 and thereby improve standoff voltage capability. The result is a conflicting set of design objectives, driven by the need for a high impurity concentration (e.g., carbon concentration) in III-Nitride intermediate body 212 to enhance breakdown resistance, and concurrently a low impurity concentration (e.g., carbon concentration) in III-Nitride intermediate body 212 to minimize trapping and to reduce dynamic Rdson. That conflict may be resolved by implementing III-Nitride intermediate body 212 having a selectively reduced impurity concentration, wherein a higher impurity concentration at bottom surface 211 is selectively reduced to a lower impurity concentration at top surface 213, as disclosed herein.

Figure 8:
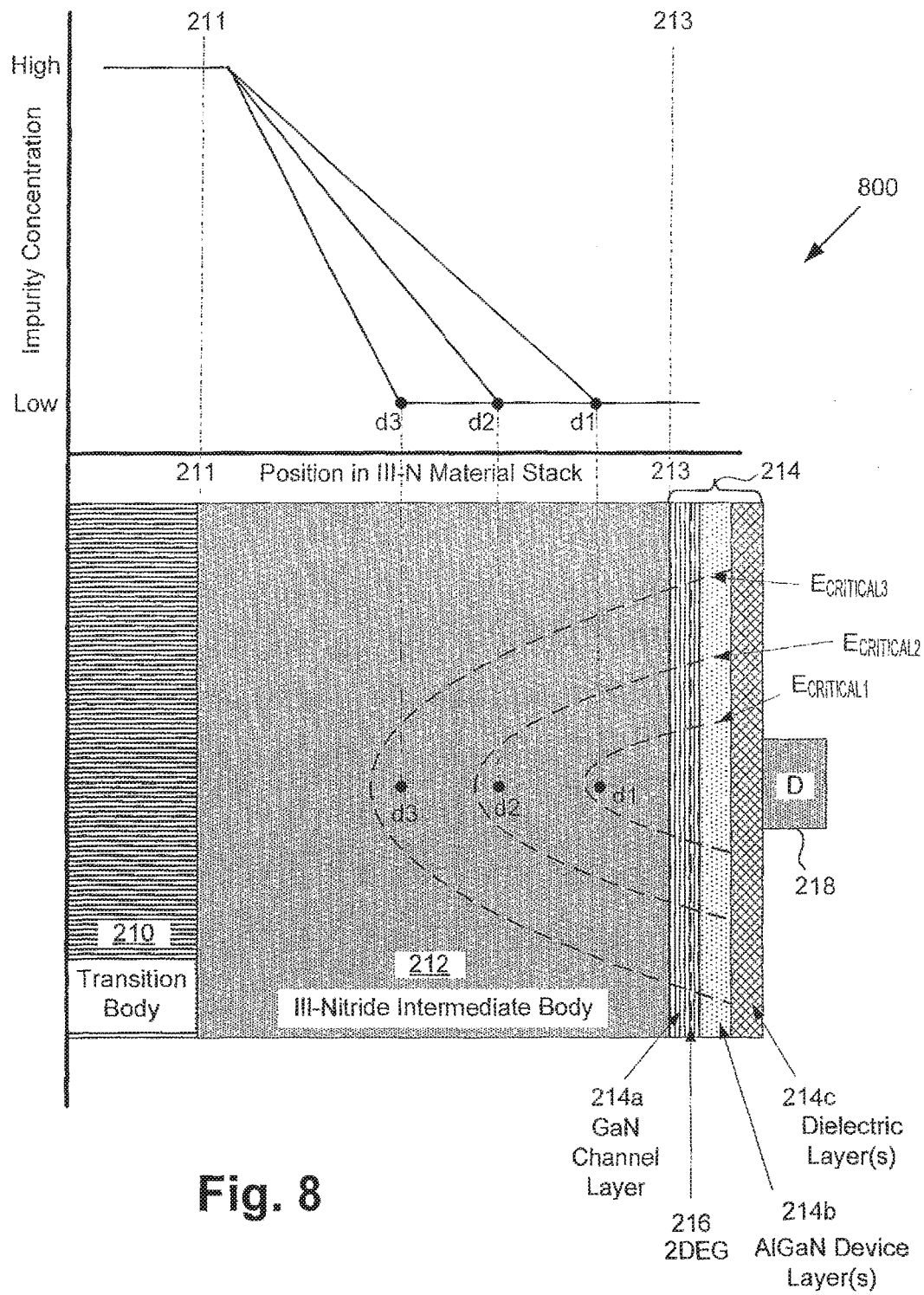
FIG. 8 presents a diagram relating exemplary critical electric fields produced in a III-Nitride device structure by an applied voltage, and exemplary selective reduced impurity concentrations within the III-Nitride device structure.

Referring now to FIG. 8, a III-Nitride material stack is shown which forms a typical GaN based HEMT structure 800. Structure 800 includes transition body 210. As noted above, transition body 210 may be formed as a III-Nitride transition body including AlN, for example. Transition body 210 may be fabricated over a III-Nitride nucleation, strain relieving layer(s), other additional layer(s), as well as a substrate corresponding to substrate 202, in. FIG. 2 (substrate and any layers underlying transition body 210 not shown in FIG. 8).

Structure 800 also included III-Nitride intermediate body 212 having bottom surface 211 fabricated over transition body 210. In some implementations, it may be preferred that III-Nitride intermediate body 212 be fabricated as a constant alloy composition of $Al_xGa_{1-x}N$ where $0.04<x<0.10$. It may also be advantageous that a thickness of III-Nitride intermediate body 212, that is the distance from bottom surface 211 to top surface 213 across III-Nitride intermediate body 212, be in a range from approximately 200 nm to approximately 2,000 nm.

As further shown in FIG. 8, III-Nitride device layer 214 is fabricated over layer III-Nitride intermediate body 212. III-Nitride device layer 214 represents the III-Nitride HEMT device layers and may include several sub-layers including GaN based channel layer 214a, AlGaN barrier layer and spacer layers 214b, and dielectric layer or other layers 214c. Although three exemplary sub-layers are shown in FIG. 8, other layers or sub-layers may also be included and are within the scope of the present inventive concepts. Also shown in FIG. 8 is 2DEG 216 and drain contact or electrode 218. It is noted that source and gate contacts or electrodes are omitted from FIG. 8 for conceptual clarity.

If properly constructed, structure 800 will generate 2DEG 216 near the interface of GaN channel layer 214a and the AlGaN barrier layer included in AlGaN device layers 214b. According to the implementation shown in FIG. 8, structure 800 provides a depletion node (normally ON) HEMT, and 2DEG 216 would exist in a state when there is no applied gate voltage. 2DEG 216 includes high mobility electrons which are the majority carriers traveling from the source (not shown) to drain contact or electrode 218 of structure 800.

During operation of the HEMT, when a voltage bias is applied to drain contact or electrode 218 of structure 800, a critical electric field will be generated under drain contact or electrode 218 that is proportional to the voltage applied to drain contactor electrode 218. It is reiterated that, as used herein, critical electric field is defined as the minimum field, associated with art applied voltage to drain contact or electrode 218, which results in a high probability of changing the charge state of an impurity residing within the critical electric field perimeter of an effected III-Nitride layer(s).

As an example, for a given voltage 1 (V1) applied to drain contact or electrode 218, the corresponding critical electric field is shown in FIG. 8 as $E_{CRITICAL1}$. $E_{CRITICAL1}$ will penetrate into GaN channel layer 214a and may also extend into III-Nitride intermediate body 212 to a depth denoted as d1 in FIG. 8. Any impurities or trapping centers which fall within the penetration depth of $E_{CRITICAL1}$ have an increased probability of having their charge states altered.

As the applied voltage is increased to a higher voltage 2 (V2), the critical electric field $E_{CRITICAL2}$ will influence the charge state of the impurities deeper into III-Nitride intermediate body 212 to depth d2. As a result, the probability of changing the charge state will increase within that extended field effected area. At high voltage operation, the critical electric field denoted as $E_{CRITICAL3}$ will influence the charge states even deeper into the III-Nitride intermediate body 212 to depth d3, and the probability of changing charge states is increased still further.

If there are any P type impurities, e.g., carbon impurities, located within GaN channel layer 214a and III-Nitride intermediate body 212, there is a high probability that their charge states will change if they fall within a region subject to the critical electric fields. These changed charge state impurities, or traps, can adversely impact the switching speed and dynamic Rdson of the HEMT formed by structure 800. Consequently, it is desirable to minimize impurities or acceptor states within GaN channel layer 214a, as well as in III-Nitride intermediate body 212 within the regions subject to the critical electric fields formed during operation of the device. Therefore, depending on the penetration depth of the critical electric fields, it would be desirable to reduce or substantially minimize impurity concentrations within GaN channel layer 214a and also within at least a portion of III-Nitride intermediate body 212.

However, as discussed above, there is the conflicting objective of fabricating Nitride intermediate body 212 to have a high concentration of carbon impurities near bottom surface 211 and into underlying transition body 210 to improve the resistivity and enhance the standoff voltage capability of the HEMT formed by structure 800. FIG. 8 shows three examples of solutions for resolving the apparent conflict by selectively reducing the impurity concentration from a higher impurity concentration at bottom surface 211 of III-Nitride intermediate body 212 to a lower impurity concentration at top surface 213 of III-Nitride intermediate body 212.

For example, if structure 800 is designed for a low voltage application (e.g., V1) then under an applied voltage to drain contact or electrode 218, a corresponding critical electric field $E_{CRITICAL1}$ will develop in proximity to the drain region and penetrate to a depth of d1 within III-Nitride intermediate layer 212. Consequently, it would be desirable to form III-Nitride intermediate layer 212 such that the carbon impurity concentration starts at a higher level upon initiation of growth (i.e., at bottom surface 211), followed by a continuous decrease at a constant rate to a lower level at a depth of at least d1. It would then further be desirable to maintain the impurity concentration at or near the lower level, throughout the remainder of the growth of III-Nitride intermediate body 212 (i.e., to top surface 213). By selectively reducing the carbon impurity concentration to a lower substantially minimal) concentration at a depth of d1, the present solution reduces or substantially minimized the population of carbon impurities with the highest probability of having their charge states changed under biasing of the device at voltage (V1).

Alternatively, if structure 800 is designed to operate at a higher drain voltage of V2, then it would be desirable to minimize the carbon impurity concentration within the area influenced by the subsequent critical electric field, $E_{CRITICAL2}$ to depth d2 within III-Nitride intermediate body 212. According to this implementation, an impurity concentration profile analogous to that formed in response to $E_{CRITICAL1}$ can be formed in III-Nitride intermediate body 212. However, the rate of reduction of the impurity concentration can be increased such that a lower (i.e., substantially minimal) impurity concentration is reached at depth of d2, as shown in FIG. 8.

Moreover, if structure 800 is designed to operate at a yet higher drain voltage of V3, it would be desirable to minimize the carbon impurity concentration within the area influenced by the subsequent critical electric field $E_{CRITICAL3}$ to an even deeper depth within III-Nitride intermediate layer 212, denoted as d3. Once again, an impurity concentration profile analogous to that formed in response to $E_{CRITICAL1}$ can be formed in III-Nitride intermediate body 212. However, the rate of reduction of the impurity concentration can be increased still more such that a lower (i.e., substantially minimal) impurity concentration is reached at depth of d3, as shown in FIG. 8.

Thus, implementations of the present inventive concepts provide a group III-V device structure having a selectively reduced impurity concentration. By fabricating a group III-V device layer over a group III-V intermediate body having a selectively reduced impurity concentration, improved device performance and reliability may be achieved. For example, by continuously reducing the impurity concentration from a higher impurity concentration at a bottom surface of the group III-V intermediate body to a lower impurity concentration at a top surface of the group III-V intermediate body, the present solution enables reduced leakage and enhanced standoff voltage capability while concurrently enabling high speed switching by reducing or substantially minimizing sources of undesirable dynamic Rdson.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A semiconductor structure, comprising:
a substrate;
a transition body over the substrate;
a group III-V intermediate body having a bottom surface over the transition body; and
a group III-V device layer over a top surface of the group III-V intermediate body,
wherein the group III-V intermediate body has a first impurity concentration at the bottom surface, a second impurity concentration at the top surface, and a variable impurity concentration that rises and falls between the bottom surface and the top surface,
wherein the first impurity concentration is greater than the second impurity concentration.

2. The semiconductor structure of claim 1, wherein an impurity producing the first impurity concentration at the bottom surface, the second impurity concentration at the top surface and the variable impurity concentration is a P type impurity.

3. The semiconductor structure of claim 1, wherein the variable impurity concentration is a variable carbon concentration.

4. The semiconductor structure of claim 1, wherein the variable impurity concentration includes a plurality of impurity species.

5. The semiconductor structure of claim 1, wherein the group III-V intermediate body comprises a compositionally graded III-Nitride body having a first III-Nitride composition at the bottom surface and a second III-Nitride composition above the bottom surface.

6. The semiconductor structure of claim 1, wherein the transition body includes a group III-V transition structure having a selectively modified impurity concentration such that a bottom surface impurity concentration of the group III-V transition structure is selectively modified to a top surface impurity concentration of the group III-V transition structure.

7. The semiconductor structure of claim 6, wherein the selectively modified impurity concentration is modified in a step-wise fashion from the bottom surface impurity concentration to the top surface impurity concentration.

8. The semiconductor structure of claim 6, wherein the selectively modified impurity concentration rises and falls between the bottom surface impurity concentration and the top surface impurity concentration.

9. A method, comprising:
fabricating a transition body over a substrate;
fabricating a group III-V intermediate body having a bottom surface over the transition body; and
fabricating a group III-V device layer over a top surface of the group III-V intermediate body,
wherein fabricating the group III-V intermediate body comprises providing a first impurity concentration at the bottom surface, a second impurity concentration at the top surface, and a variable impurity concentration that rises and falls between the bottom surface and the top surface, the first impurity concentration being greater than the second impurity concentration.

10. The method of claim 9, wherein an impurity producing the first impurity concentration at the bottom surface, the second impurity concentration at the top surface and the variable impurity concentration is a P type impurity.

11. The method of claim 9, wherein the variable impurity concentration is a variable carbon concentration.

12. The method of claim 9, wherein the variable impurity concentration includes a plurality of impurity species.

13. The method of claim 9, wherein the group III-V intermediate body comprises a compositionally graded III-Nitride body having a first III-Nitride composition at the bottom surface and a second III-Nitride composition above the bottom surface.

14. The method of claim 9, wherein fabricating the transition body comprises fabricating a group III-V transition structure having a selectively modified impurity concentration such that a bottom surface impurity concentration of the group IH-V transition structure is selectively modified to a top surface impurity concentration of the group III-V transition structure.

15. The method of claim 14, wherein the selectively modified impurity concentration is reduced in a step-wise fashion from the bottom surface impurity concentration to the top surface impurity concentration.

16. The method of claim 14, wherein the selectively modified impurity concentration rises and falls between the bottom surface impurity concentration and the top surface impurity concentration.

17. A semiconductor structure, comprising:
a substrate;
a transition body over the substrate;
a group III-V intermediate body having a bottom surface over the transition body; and
a group III-V device layer over a top surface of the group III-V intermediate body,
wherein the group III-V intermediate body comprises a variable impurity concentration that rises and falls a plurality of times between the bottom surface and the top surface.

18. The semiconductor structure of claim 17, wherein an impurity producing the variable impurity concentration is a P type impurity.

19. The semiconductor structure of claim 17, wherein the variable impurity concentration is a variable carbon concentration.

20. The semiconductor structure of claim 17, wherein the variable impurity concentration includes a plurality of impurity species.

* * * * *